(12) United States Patent
Sheng et al.

(10) Patent No.: US 6,552,272 B1
(45) Date of Patent: Apr. 22, 2003

(54) ANTI-ABRASIVE FLAT FLEXIBLE CABLE

(75) Inventors: Kung-Cho Sheng, Taipei (TW); Wen-Lung Hung, Taipei (TW)

(73) Assignee: Primax Electronics, Ltd. (TW)

( * ) Notice: Subject to any disclaimer, the term of this patent is extended or adjusted under 35 U.S.C. 154(b) by 0 days.

(21) Appl. No.: 10/047,600

(22) Filed: Jan. 14, 2002

(30) Foreign Application Priority Data

Oct. 19, 2001 (TW) ..................................... 090125858 A

(51) Int. Cl.⁷ ................................................ H01B 7/08
(52) U.S. Cl. ................................................ 174/117 FF
(58) Field of Search ........................ 174/117 F, 117 FF; 191/12.2 R, 12.4

(56) References Cited

U.S. PATENT DOCUMENTS 3,835,929 A * 9/1974 Suman, Jr. ................. 166/384

FOREIGN PATENT DOCUMENTS

| EP | 2 784 495 | * 10/1998 |
| JP | 11-354241 | * 12/1999 |

* cited by examiner

*Primary Examiner*—Chau N. Nguyen
(74) *Attorney, Agent, or Firm*—Madson & Metcalf

(57) ABSTRACT

An anti-abrasive flat flexible cable for use with an image scanner for electrically connecting a carriage with a circuit board is disclosed. The flat flexible cable includes a metal foil having a first end electrically connected to the circuit board and a second end electrically connected to the carriage for signal transmission between the circuit board and carriage; a thermoplastic plastic wrapper enclosing the metal foil with two opposite ends of the metal foil exposed for electric connection with the circuit board and the carriage, respectively; and a spacer strip selected from a group consisting of Teflon, Nylon and polyoxylated methylene (POM), and attached onto the thermoplastic plastic wrapper for isolating the thermoplastic plastic wrapper from the glass scanning platform.

18 Claims, 6 Drawing Sheets

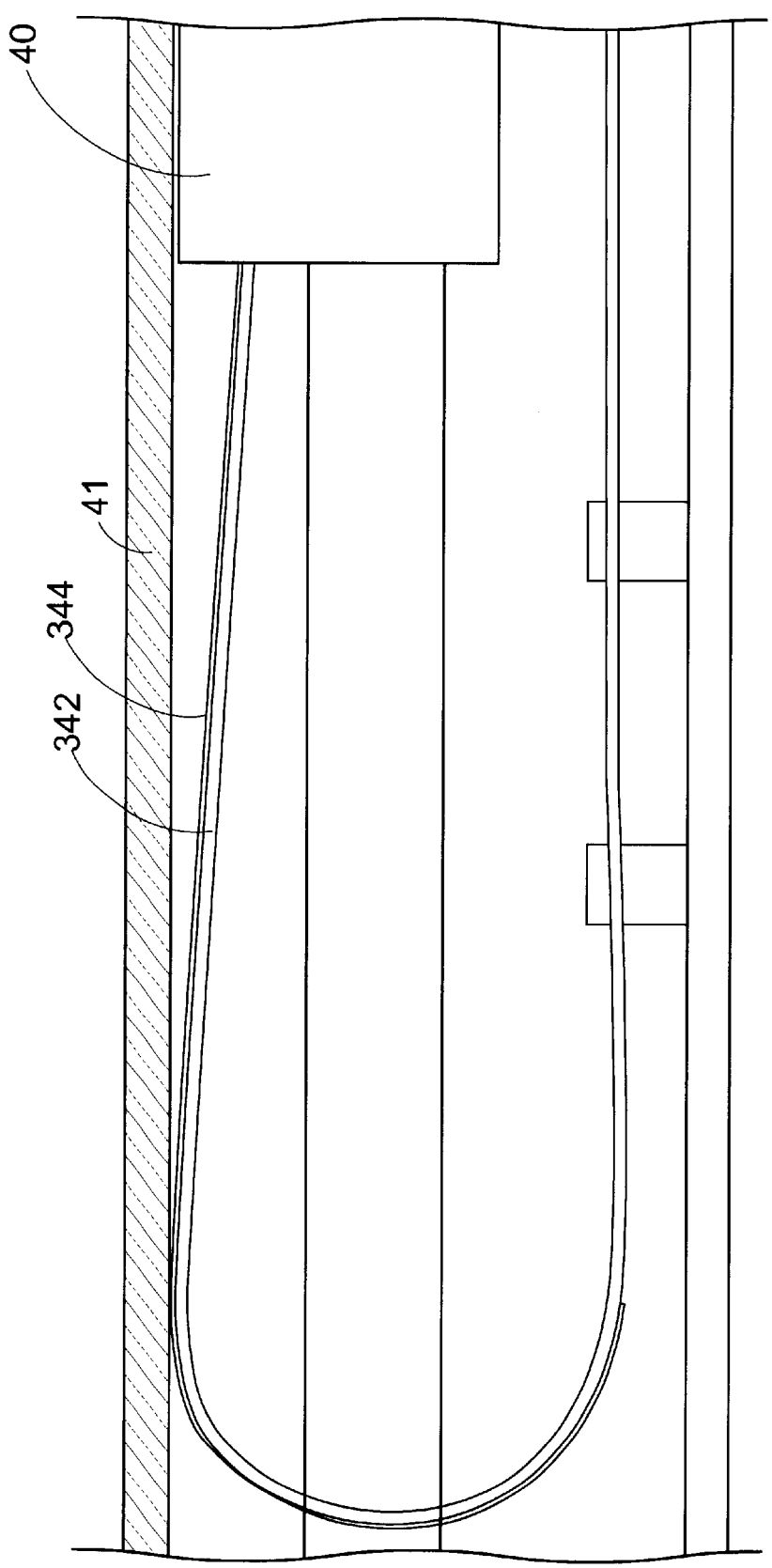

ANTI-ABRASIVE FLAT FLEXIBLE CABLE

FIELD OF THE INVENTION

The present invention relates to an anti-abrasive flat flexible cable (FFC), and more particularly to an anti-abrasive flat flexible cable adapted to be used with a thin image scanner.

BACKGROUND OF THE INVENTION

A flat flexible cable is a common connecting wire between electric devices. It is advantageous to be easily and reversibly bent and stretched in a narrow and crowded space. For example, in a flatbed image scanner, the moving-around carriage containing therein optical and photoelectric devices is connected with the circuit board through a flat flexible cable. Please refer to FIGS. 1A and 1B which are a top and a cross-sectional side views, respectively, schematically showing the connecting operation of a flat flexible cable in a flatbed image scanner. The flatbed scanner includes an upper cover (not shown) and a lower housing 10. In the lower housing, a carriage 11 containing therein optical and photoelectric devices, a driving device 12 consisting of a motor and gear set 121 and a rail set 122, a circuit board 13 including various electronic elements, and a flat flexible cable 14 connecting the carriage 11 with the circuit board 13 are sealed under a transparent scanning platform 15. The carriage 11 is moved by the motor and gear set 121 along the rail set 122 to pass by and scan a document or picture placed on the transparent platform 15 so as to realize the image data of the document or picture.

Please refer to FIG. 2 which is a schematic cross-sectional diagram showing the structure of a conventional flat flexible cable. The flat flexible cable 14 includes a flexible copper foil 141, an insulating wrapper 142 made of a flexible plastic, and a strengthening plate 143 made of a rigid plastic. The insulating wrapper 142 surrounds the copper foil 141 with two ends of the copper foil 141 exposed for electric contact with the carriage 11 and the circuit board 13, respectively. The strengthening plate 143 is mounted onto the end portion of the flat flexible cable 14 to facilitate the insertion of the exposed copper foil into the connecting slot (not shown) of the carriage 11 or the circuit board 13. Further referring to FIG. 1B again, a portion 142 of the flat flexible cable 14 connecting to the circuit board 13 is fixed on the bottom of the lower housing 10, and another portion 143 connecting to the carriage 11 is freely bent and stretched along with the movement of the carriage 11.

During the movement of the carriage 11, the flat flexible cable keeps on electrically connecting the carriage 11 with the circuit board 13 for signal transmission. The configuration of the flat flexible cable 14 changes all the time during the movement of the carriage 11 along a scanning direction indicated by an arrow C. It is understood at any moment, however, the distant end 141 of the flat flexible cable 14 from the carriage 11, i.e. the U-turn portion, raises up to the inner surface of the platform 15 due to the flexible property thereof. Especially for an image scanner using a contact image sensor (CIS) as an image pickup device which requires close contact with the document on the platform 15, the flat flexible cable 14 generally keeps in contact with the inner surface of the platform 15 by a part thereof. For example, at a start position where the carriage 11 is adjacent to the circuit board 13, the flat flexible cable 14 is bent to have a U-turn point at a position relative to the position A on the platform 15, as shown in the solid line. On the other hand, at a scanning position where the carriage 11 moves away from the circuit board 13, the U-turn position shifts to a position B on the platform 15 along the scanning direction C, as indicated by the dotted line. As a result, abrasion is likely to occur due to the contact of the insulating wrapper 142 of the flat flexible cable 14 with the transparent platform 15 and the movement of the contact point from the position A to the position B. In general, the insulating wrapper 142 is made of a thermoplastic plastic material and the platform 15 is made of glass. As known, a general thermoplastic plastic material has a smaller hardness than the hardness of the platform 15, and the frictional coefficient between the plastic and glass is not low enough to avoid abrasion. The plastic chips resulting from the abrasion by the glass platform may adversely affect the scanning quality.

SUMMARY OF THE INVENTION

Therefore, an object of the present invention is to provide an anti-abrasive flat flexible cable which isolates the plastic wrapper from the glass platform to avoid abrasion.

A first aspect of the present invention relates to an anti-abrasive flat flexible cable for use with an image scanner for electrically connecting a carriage with a circuit board. The flat flexible cable is bent at different positions thereof with the movement of the carriage relative to the circuit board under a scanning platform. The anti-abrasive flat flexible cable includes a flexible conductive portion having a first end electrically connected to the circuit board and a second end electrically connected to the carriage for signal transmission between the circuit board and carriage; a flexible insulating portion wrapping around the flexible conductive portion for protecting the flexible conductive portion; and a flexible spacer portion attached onto the flexible insulating portion, and positioned between the flexible insulating portion and the scanning platform for isolating the flexible insulating portion from the scanning platform.

Preferably, the flexible conductive portion includes a copper foil.

Preferably, the flexible insulating portion is made of a thermoplastic plastic material.

Preferably, a hardness of the flexible spacer portion and a frictional coefficient between the flexible spacer portion and the scanning platform are small enough to substantially render no chip on contact.

In an embodiment, the scanning platform is made of glass, and the flexible spacer portion is made of a material selected from a group consisting of Teflon, Nylon and polyoxylated methylene (POM).

In another embodiment, the scanning platform is made of glass, and the flexible spacer portion is made of a composite material including Nylon and POM.

Preferably, the anti-abrasive flat flexible includes a rigid supporting plate mounted to each of the first and second ends of the flexible conductive portion for facilitating the exertion of an external force to insert the flexible conductive portion to a slot of the circuit board or the carriage. The flexible spacer portion is disposed between the rigid supporting plate and the flexible conductive portion, and extends along the flexible insulating portion over a half length of the flexible insulating portion.

A second aspect of the present invention relates to an anti-abrasive flat flexible cable used in a housing for signal transmission between a first and a second devices. The anti-abrasive flat flexible cable includes a flexible conducting core for conducting an electronic signal; and a flexible insulating wrapper enclosing the flexible conductive core for protecting the flexible conductive core with two opposite ends of the flexible conductive core exposed for electric connection to the first and second devices, respectively, wherein the flexible insulating wrapper includes a spacer portion possibly in contact with the housing, and a hardness of the spacer portion and a frictional coefficient between the spacer portion and the housing are small enough to substantially render no chip on contact.

Preferably, the flexible conductive core is formed of a copper foil, and the flexible insulating wrapper includes a thermoplastic layer and a spacer strip formed on the thermoplastic layer as the spacer portion.

Preferably, the spacer strip extends along the thermoplastic layer over a half length of the thermoplastic layer.

When the flat flexible cable is used in a housing including a glass plate, the spacer strip preferably has a hardness and a frictional coefficient on glass small enough to substantially render no chip on contact.

Preferably, the spacer strip is made of a material selected from a group consisting of Teflon, Nylon and polyoxylated methylene (POM). Alternatively, the spacer strip is made of a composite material including Nylon and POM.

Preferably, the flat flexible cable further includes a rigid supporting plate mounted to each of the two opposite ends of the flexible conductive core for facilitating the exertion of an external force to insert the flexible conductive core into a slot of either of the first and second devices.

A third aspect of the present invention relates to an anti-abrasive flat flexible cable for use with an image scanner for electrically connecting a carriage with a circuit board. The flat flexible cable is bent at different positions thereof with the movement of the carriage relative to the circuit board under a glass platform, and includes a metal foil having a first end electrically connected to the circuit board and a second end electrically connected to the carriage for signal transmission between the circuit board and carriage; a thermoplastic plastic wrapper enclosing the metal foil with two opposite ends of the metal foil exposed for electric connection with the circuit board and the carriage, respectively; and a spacer strip selected from a group consisting of Teflon, Nylon and polyoxylated methylene (POM), and attached onto the thermoplastic plastic wrapper for isolating the thermoplastic plastic wrapper from the glass platform.

DESCRIPTION OF THE DRAWINGS

The present invention may best be understood through the following description with reference to the accompanying drawings, in which:

FIG. 4 is a partial enlarged view of a flat flexible cable for use with a CIS-type image scanner according to the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1A:
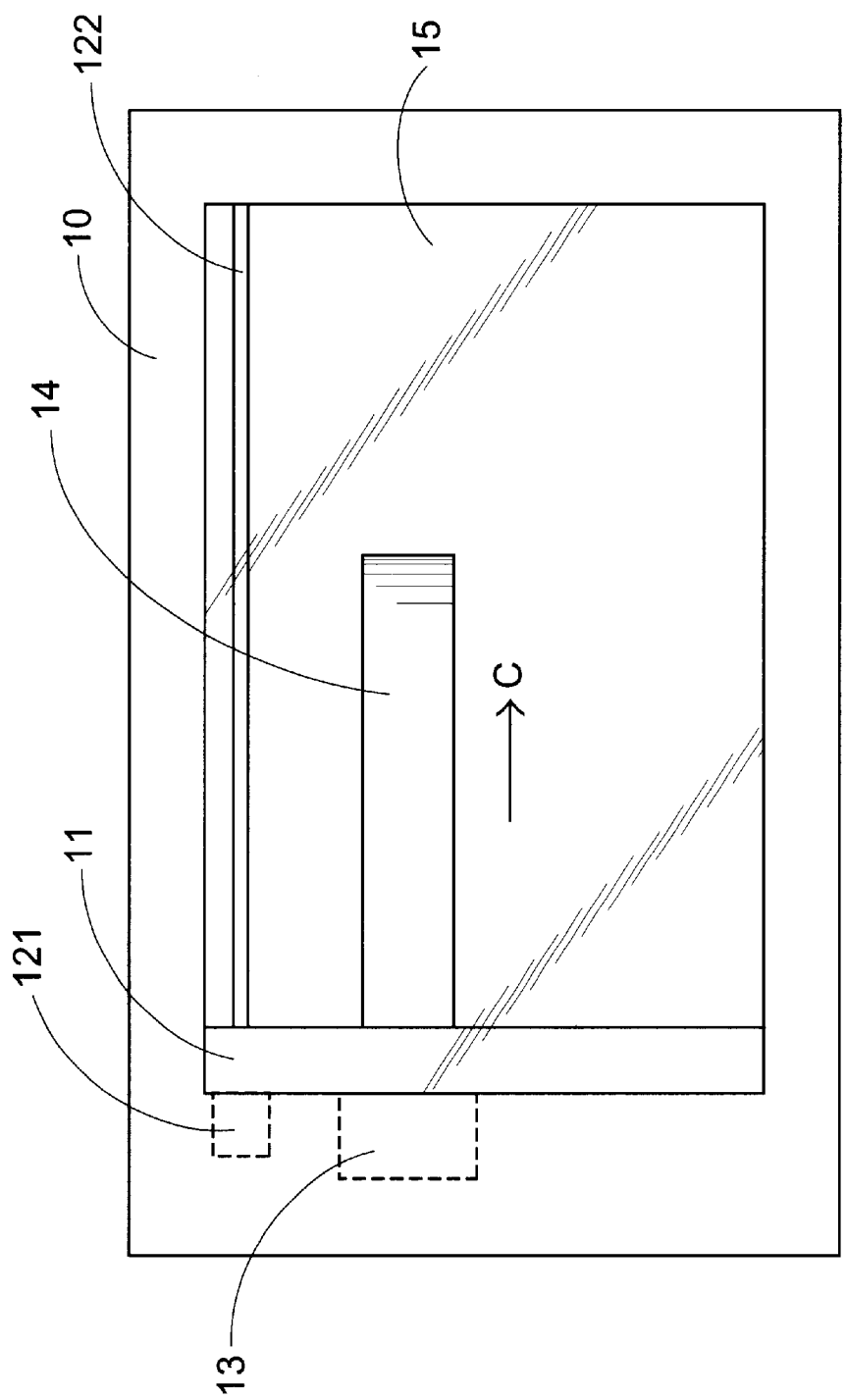
FIG. 1A is a schematic top plane view of a typical flatbed scanner.
Figure 1B:
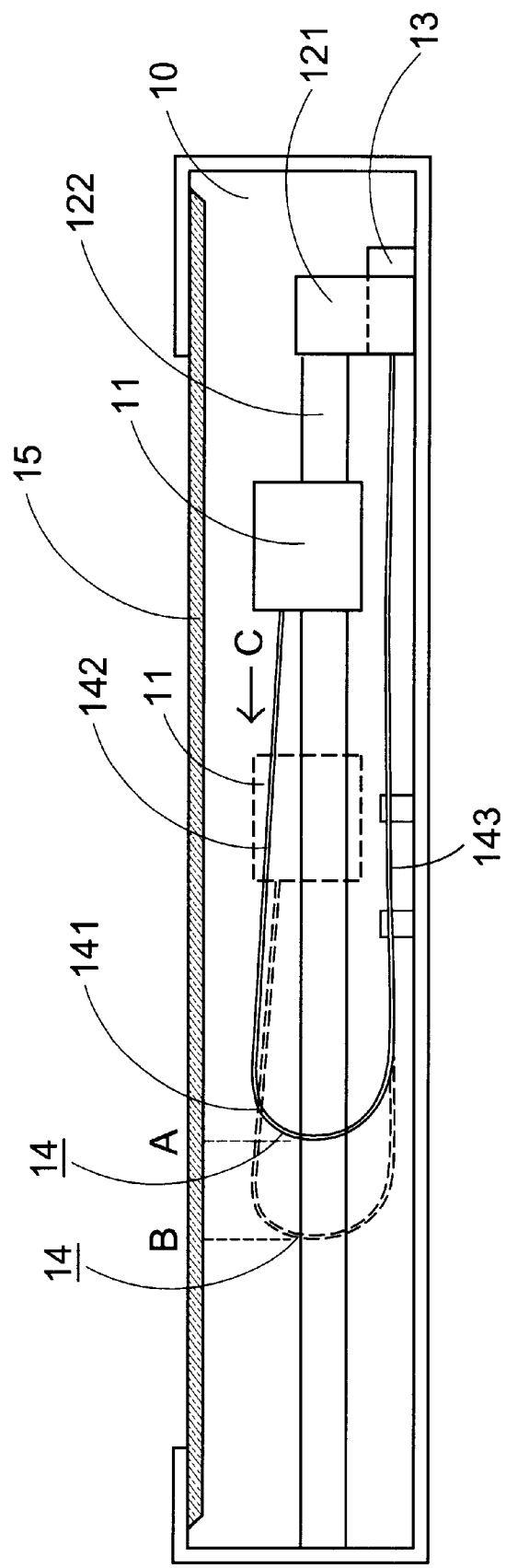
FIG. 1B is a schematic cross-sectional side view of the scanner of FIG. 1A.
Figure 2:
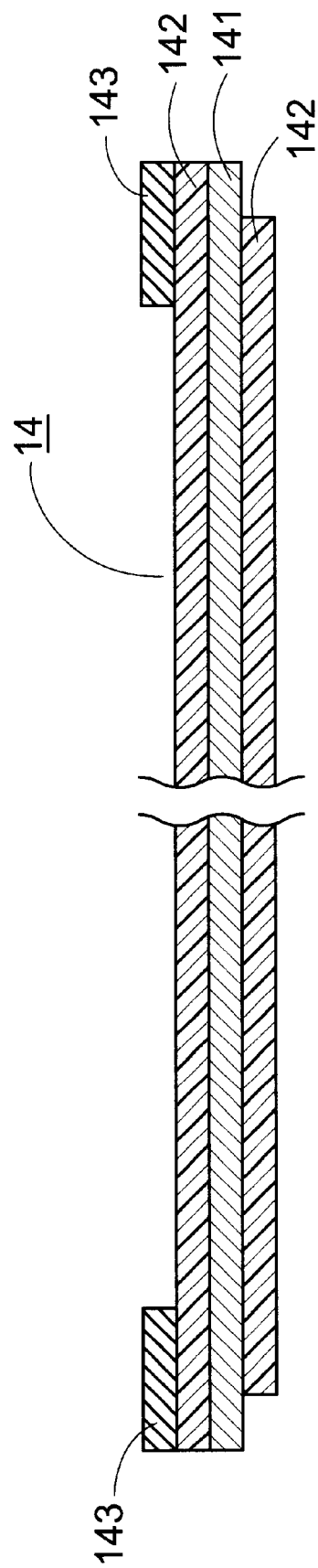
FIG. 2 is a schematic cross-sectional side view of a conventional flat flexible cable.
Figure 3A:
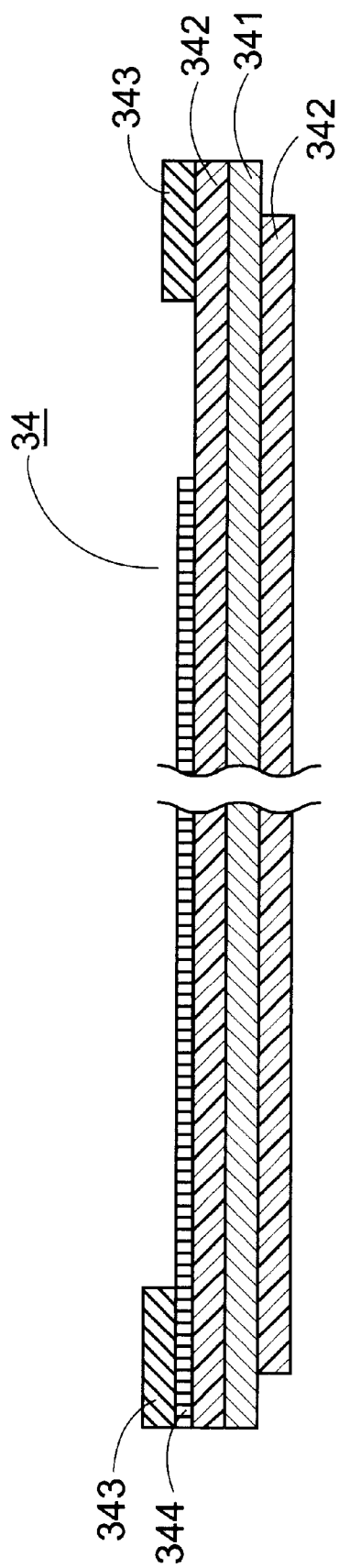
FIG. 3A is a schematic cross-sectional side view of a preferred embodiment of a flat flexible cable according to the present invention.
Figure 3B:
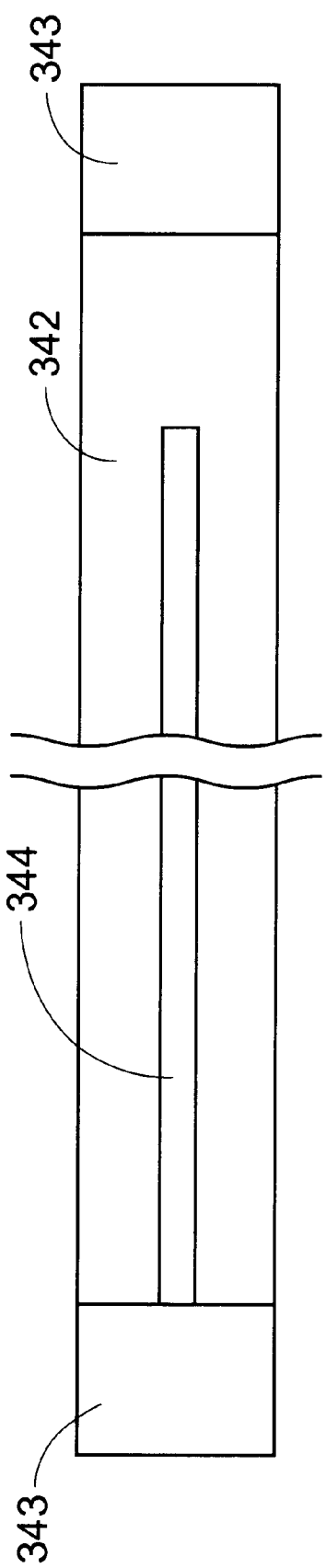
FIG. 3B is a schematic top plane view of the flat flexible cable of FIG. 3A.

Please refer to FIGS. 3A and 3B which illustrate a preferred embodiment of a flat flexible cable according to the present invention. The flat flexible cable 34 includes a metal foil core 341 such as a copper foil, an insulating wrapper layer 342 enclosing the metal foil 341 with two opposite ends of the metal foil core 341 exposed, two rigid supporting plates 343 mounted on the opposite ends of the metal foil core 341, and a spacer strip 344 positioned between the rigid supporting plates 343 and the insulating wrapper layer 342 and extending over a half length of the insulating wrapper layer 342. The exposed ends of the metal foil core 341 is to be inserted into respective slots of a circuit board and a carriage of an image scanner for signal transmission therebetween, referring to FIGS. 1A and 1B. When the flat flexible cable 34 is used in a CIS-type image scanner in which the carriage 40 is close to the scanning platform 41, the flat flexible cable is likely to be in contact with the glass scanning platform 41, as shown in FIG. 4. The presence of the spacer strip 344 isolates the vulnerable insulating wrapper layer 342 which is generally made of a thermoplastic plastic material from the glass platform to avoid chip. For assuring of the isolation effect, it is preferred that the spacer strip 344 is present in the middle part of the cable 34 which may be bent during the movement of the carriage. Therefore, in this embodiment, the spacer strip 344 extends over a half length of the insulating wrapper layer 342. Alternatively, the spacer strip 344 can be attached only to the middle part of the insulating wrapper layer 342 by way of reliable adhesion. Further, in order not to scratch the glass platform and be scratched by the glass platform, the spacer strip 344 is preferably made of Teflon, Nylon, polyoxylated methylene (POM) or any other material which is less hard than glass and has small frictional coefficients on glass.

The width of the spacer strip is not especially limited. However, it is preferred to take the factors of processibility and cost into consideration.

In addition to the structural improvement by providing a spacer strip on the conventional flat flexible cable, it is feasible to incorporate the spacer material mentioned above into the material of the insulating wrapper to modify the insulating wrapper so as to have a hardness and frictional coefficient on glass small enough to render no significant amount of chips.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An anti-abrasive flat flexible cable for use with an image scanner for electrically connecting a carriage with a circuit board, said flat flexible cable being bent at different positions thereof with the movement of said carriage relative to said circuit board under a scanning platform, and comprising:

a flexible conductive portion having a first end electrically connected to said circuit board and a second end electrically connected to said carriage for signal transmission between said circuit board and carriage;

a flexible insulating portion wrapping around said flexible conductive portion for protecting said flexible conductive portion; and a flexible spacer portion attached onto said flexible insulating portion, and positioned between said flexible insulating portion and said scanning platform for isolating said flexible insulating portion from said scanning platform, wherein said scanning platform is made of glass, and said flexible spacer portion is made of a material selected from a group consisting of Teflon, polyoxylated methylene (POM) and a composite material including Nylon and POM, and a hardness of said flexible spacer portion and a frictional coefficient between said flexible spacer portion and said scanning platform are small enough to substantially render no chip on contact.

2. The anti-abrasive flat flexible cable according to claim 1 wherein said flexible conductive portion includes a copper foil.

3. The anti-abrasive flat flexible cable according to claim 1 wherein said flexible insulating portion is made of a thermoplastic plastic material.

4. The anti-abrasive flat flexible cable according to claim 1 further comprising a rigid supporting plate mounted to each of said first and second ends of said flexible conductive portion for facilitating the exertion of an external force to insert said flexible conductive portion to a slot of said circuit board or said carriage.

5. The anti-abrasive flat flexible cable according to claim 4 wherein said flexible spacer portion is disposed between said rigid supporting plate and said flexible conductive portion, and extends along said flexible insulating portion over a half length of said flexible insulating portion.

6. An anti-abrasive flat flexible cable used in a housing for signal transmission between a first and a second devices, and comprising:

a flexible conducting core for conducting an electronic signal; and a flexible insulating wrapper enclosing said flexible conductive core for protecting said flexible conductive core with two opposite ends of said flexible conductive core exposed for electric connection to said first and second devices, respectively, wherein said flexible insulating wrapper includes a thermoplastic layer and a spacer strip formed on said thermoplastic layer, extending along said thermoplastic layer over a half length of said thermoplastic layer and possibly in contact with said housing, and a hardness of said spacer portion and a frictional coefficient between said spacer portion and said housing are small enough to substantially render no chip on contact.

7. The anti-abrasive flat flexible cable according to claim 6 wherein said flexible conductive core is formed of a copper foil.

8. The anti-abrasive flat flexible cable according to claim 6 wherein said housing includes a glass plate, and said spacer strip has a hardness and a frictional coefficient on glass small enough to substantially render no chip on contact.

9. The anti-abrasive flat flexible cable according to claim 8 wherein said spacer strip is made of a material selected from a group consisting of Teflon, Nylon and polyoxylated methylene (POM).

10. The anti-abrasive flat flexible cable according to claim 8 wherein said spacer strip is made of a composite material including Nylon and POM.

11. The anti-abrasive flat flexible cable according to claim 6 further comprising a rigid supporting plate mounted to each of said two opposite ends of said flexible conductive core for facilitating the exertion of an external force to insert said flexible conductive core into a slot of either of said first and second devices.

12. An anti-abrasive flat flexible cable for use with an image scanner for electrically connecting a carriage with a circuit board, said flat flexible cable being bent at different positions thereof with the movement of said carriage relative to said circuit board under a scanning platform, and comprising:

a flexible conductive portion having a first end electrically connected to said circuit board and a second end electrically connected to said carriage for signal transmission between said circuit board and carriage;

a flexible insulating portion wrapping around said flexible conductive portion for protecting said flexible conductive portion; and a flexible spacer portion attached onto said flexible insulating portion, extending along said flexible insulating portion over a half length of said flexible insulating portion, and positioned between said flexible insulating portion and said scanning platform for isolating said flexible insulating portion from said scanning platform.

13. The anti-abrasive flat flexible cable according to claim 12 wherein said flexible conductive portion includes a copper foil.

14. The anti-abrasive flat flexible cable according to claim 12 wherein said flexible insulating portion is made of a thermoplastic plastic material.

15. The anti-abrasive flat flexible cable according to claim 12 wherein a hardness of said flexible spacer portion and a frictional coefficient between said flexible spacer portion and said scanning platform are small enough to substantially render no chip on contact.

16. The anti-abrasive flat flexible cable according to claim 15 wherein said scanning platform is made of glass, and said flexible spacer portion is made of a material selected from a group consisting of Teflon, Nylon, polyoxylated methylene (POM) and a composite material thereof.

17. The anti-abrasive flat flexible cable according to claim 12 further comprising a rigid supporting plate mounted to each of said first and second ends of said flexible conductive portion for facilitating the exertion of an external force to insert said flexible conductive portion to a slot of said circuit board or said carriage.

18. The anti-abrasive flat flexible cable according to claim 17 wherein said flexible spacer portion is disposed between said rigid supporting plate and said flexible conductive portion.

* * * * *